(12) United States Patent
Yiu et al.

(10) Patent No.: US 6,785,152 B2
(45) Date of Patent: Aug. 31, 2004

(54) CONTENT ADDRESSABLE MEMORY WITH POWER REDUCTION TECHNIQUE

(75) Inventors: George Kong Yiu, Sunnyvale, CA (US); Mark H. Pearce, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/641,130

(22) Filed: Aug. 14, 2003

(65) Prior Publication Data

US 2004/0052133 A1 Mar. 18, 2004

Related U.S. Application Data

(63) Continuation of application No. 09/957,744, filed on Sep. 21, 2001, now Pat. No. 6,646,899.

(51) Int. Cl.[7] .............................. G11C 15/00; G11C 8/00
(52) U.S. Cl. .......................................... 365/49; 365/233
(58) Field of Search .......................... 365/49, 233, 190, 365/189.08

(56) References Cited

U.S. PATENT DOCUMENTS

| | | | |
|---|---|---|---|
| 5,598,115 A | 1/1997 | Holst | |
| 5,754,463 A | 5/1998 | Henstrom et al. | |
| 6,166,939 A | 12/2000 | Nataraj et al. | |
| 6,175,514 B1 | 1/2001 | Henderson et al. | |
| 6,246,614 B1 * | 6/2001 | Ooishi | 365/191 |
| 6,266,263 B1 | 7/2001 | Lien et al. | |

OTHER PUBLICATIONS

SiByte, "Target Applications," http://sibyte.com/mercurian/applications.htm, Jan. 15, 2001, 2 pages.
SiByte, "SiByte Technology," http://sibyte.com/mercurian/technology.htm, Jan. 15, 2001, 3 pages.
SiByte, "The Mercurian Processor," http://sibyte.com/mercurian, Jan. 15, 2001, 2 pages.
SiByte, "Fact Sheet," SB–1 CPU, Oct. 2000, rev. 0.1, 1 page.
SiByte, "Fact Sheet," SB–1250, Oct. 2000, rev. 0.2, 10 pages.
Stepanian, SiByte, SiByte SB–1 MIPS64 CPU Core, Embedded Processor Forum 2000, Jun. 13, 2000, 15 pages.
Jim Keller, "The Mercurian Processor: A High Performance, Power–Efficient CMP for Networking," Oct. 10, 2000, 22 pages.
Tom R. Halfhill, "SiByte Reveals 64–Bit Core For NPUs; Independent MIPS64 Design Combines Low Power, High Performance," Microdesign Resources, Jun. 2000, Microprocessor Report, 4 pages.
SiByte, Letter from Anu Sundaresan, May 18, 2000, 1 page.

* cited by examiner

Primary Examiner—Thong Q. Le
(74) Attorney, Agent, or Firm—Lawrence J. Merkel (57) ABSTRACT

A CAM may include a plurality of CAM cells. Each CAM cell is configured to generate an output indicating if a corresponding input bit and the bit stored in that CAM cell match. A circuit is configured to logically AND the outputs to generate a hit output. A first compare line generator circuit is configured to generate a first pulse responsive to a clock signal and a data signal and a second compare line generator circuit is configured to generate a second pulse responsive to the clock signal and the complement of the data signal. A CAM may include a circuit configured to generate a pulse indicating a hit in an entry of the CAM and a latch circuit configured to capture the pulse responsive to the first clock signal and configured to clear responsive to the second clock signal. A first CAM may store a value in each entry and may further store a compare result. A second CAM may include entries corresponding to the entries in the first CAM, and each entry may be coupled to receive the indication of the compare result from the corresponding entry of the first CAM and is configured to generate a second compare result which includes the first compare result.

17 Claims, 7 Drawing Sheets

CONTENT ADDRESSABLE MEMORY WITH POWER REDUCTION TECHNIQUE

This application is a continuation of U.S. patent application Ser. No. 09/957,744, filed on Sep. 21, 2001, now U.S. Pat. No. 6,646,899.

BACKGROUND OF THE INVENTION

1. Field of the Invention

This invention is related to the field of content addressable memories and, more particularly, to power reduction techniques in content addressable memories.

2. Description of the Related Art

Content addressable memories (CAMs) have a variety of uses in integrated circuits. Generally, a CAM is a memory comprising a plurality of entries, and each entry is configured to store a value. An input value to the CAM is compared to the values stored in the entries, and an indication of which entry (or entries) is storing a value equal to the input value is provided as an output of the CAM. If an entry is storing a value equal to the input value, the input value is said to be a hit in the CAM.

One exemplary use of a CAM is in a translation lookaside buffer (TLB) in a processor. The CAM may be used to store a portion of the virtual address (that portion which is translated from the virtual address to the physical address, also referred to as the virtual page number or VPN). A corresponding random access memory (RAM) may be included which stores the corresponding portion of the physical address (also referred to as the page frame number (PFN)) for each virtual address in the CAM. The indication of a hit in a particular entry of the CAM may be used to read the physical address from the corresponding entry of the RAM. Many other uses for CAMs are found both in processors and in other types of integrated circuits.

Generally, CAM memories have a dynamic OR-based exclusive NOR structure. In such a structure, the bits of the value in a given CAM entry are exclusive NORed with corresponding bits of input value to be compared. The resulting output signals are ORed together to produce the compare result for the entry. If any bit in the entry miscompares, the OR result is a logical one (miss), and if all bits are equal the OR result is a logical zero (hit). In a dynamic OR, the output is precharged to logical zero and transitions to a logical one if any inputs are a logical one. Accordingly, each entry for which a miss is detected consumes power in generating the result for such a structure.

SUMMARY OF THE INVENTION

In one embodiment, a CAM is provided which includes a plurality of CAM cells and a circuit coupled to the plurality of CAM cells. Each of the plurality of CAM cells is configured to store a different bit of a value and is coupled to receive a corresponding bit of an input value. Each CAM cell is configured to generate an output indicating if the corresponding input bit and the bit stored in that CAM cell match. The circuit is coupled to receive the outputs from the plurality of CAM cells and is configured to logically AND the outputs to generate a hit output. The hit output indicates whether or not the input value matches the stored value.

In another embodiment, a pair of compare line generator circuits are provided. One of the compare line generator circuits is coupled to receive a clock signal and a data signal, and is configured to generate a first pulse responsive to the clock signal and the data signal. The other of the compare line generator circuits is coupled to receive the clock signal and a complement of the data signal, and is configured to generate a second pulse responsive to the clock signal and the complement of the data signal. In one implementation, the first and second pulses may be provided to a CAM cell for selection as a compare output of the CAM cell dependent of the value stored in the CAM cell. In one embodiment, the compare line generator circuits are further coupled to receive a mask input and are configured to generate both the first and the second pulses responsive to the clock signal and the mask input.

In yet another embodiment, a CAM is contemplated including a circuit configure to generate a pulse indicating a hit in an entry of the CAM. The CAM further includes a latch circuit coupled to receive the pulse, a first clock signal, and a second clock signal. The latch is configured to capture the pulse responsive to the first clock signal and is configured to clear responsive to the second clock signal. In one implementation, the output of the latch is used as a word line to a RAM. In one embodiment, the second clock signal is delayed from a third clock signal by an amount which provides a minimum width of the word line in a phase of the third clock signal in which the RAM is read.

In still another embodiment, a first CAM and a second CAM are provided. The first CAM may store a value in each entry and may further store a compare result of the value and an input value to the first CAM. The second CAM may include entries corresponding to the entries in the first CAM, and each entry may be coupled to receive the indication of the compare result from the corresponding entry of the first CAM and is configured to generate a second compare result which includes the first compare result. In one implementation, the first and second CAMs may be included in a translation lookaside buffer, with the first CAM storing an address space identifier and the second CAM storing a virtual address (or portion thereof).

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Processor Overview

Figure 1:
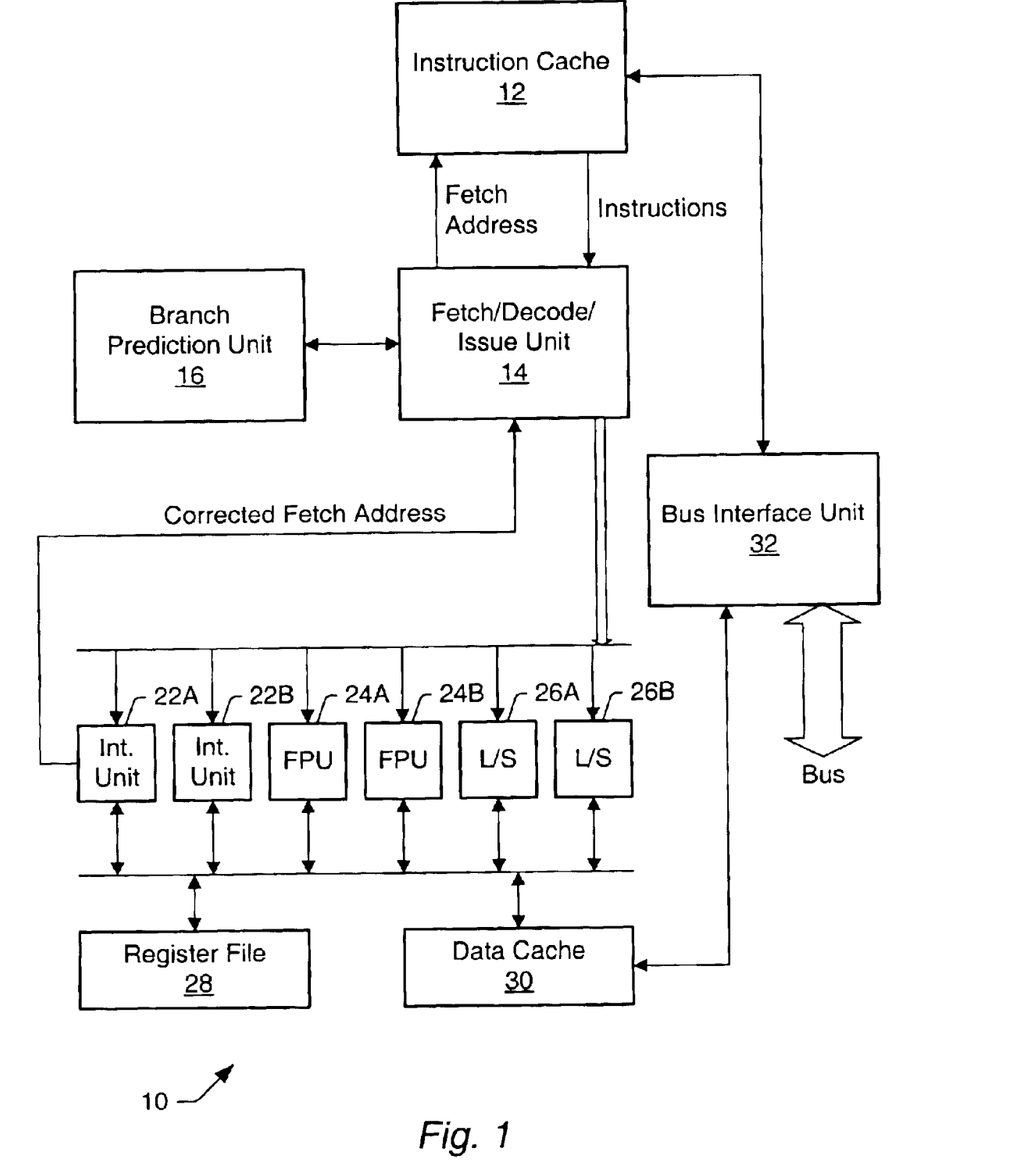
FIG. 1 is a block diagram of one embodiment of a processor.

Turning now to FIG. 1, a block diagram of one embodiment of a processor 10 is shown. Other embodiments are possible and contemplated. In the embodiment of FIG. 1, the processor 10 includes an instruction cache 12, a fetch/decode/issue unit 14, a branch prediction unit 16, a set of integer execution units 22A–22B, a set of floating point execution units 24A–24B, a set of load/store execution units 26A–26B, a register file 28, a data cache 30, and a bus interface unit 32. The instruction cache 12 is coupled to the bus interface unit 32, and is coupled to receive a fetch address from, and provide corresponding instructions to, the fetch/decode/issue unit 14. The fetch/decode/issue unit 14 is further coupled to the branch prediction unit 16 and the execution units 22A–22B, 24A–24B, and 26A–26B. Specifically, the fetch/decode/issue unit 14 is coupled to provide a branch address to the branch prediction unit 16 and to receive a prediction and/or a target address from the branch prediction unit 16. The fetch/decode/issue unit 14 is coupled to provide instructions for execution to the execution units 22A–22B, 24A–24B, and 26A–26B and to receive a corrected fetch address from the integer execution unit 22A. The execution units 22A–22B, 24A–24B, and 26A–26B are generally coupled to the register file 28 and the data cache 30, and the data cache 30 is coupled to the bus interface unit 32.

Generally speaking, the fetch/decode/issue unit 14 is configured to generate fetch addresses for the instruction cache 12 and to receive corresponding instructions therefrom. The fetch/decode/issue unit 14 uses branch prediction information to generate the fetch addresses, to allow for speculative fetching of instructions prior to execution of the corresponding branch instructions. Specifically, in one embodiment, the branch prediction unit 16 include an array of branch predictors indexed by the branch address (e.g. the typical two bit counters which are incremented when the corresponding branch is taken, saturating at 11 in binary, and decremented when the corresponding branch is not taken, saturating at 00 in binary, with the most significant bit indicating taken or not taken). While any size and configuration may be used, one implementation of the branch predictors 16 may be 4k entries in a direct-mapped configuration. Additionally, in one embodiment, the branch prediction unit 16 may include a branch target buffer comprising an array of branch target addresses. The target addresses may be previously generated target addresses of any type of branch, or just those of indirect branches. Again, while any configuration may be used, one implementation may provide 64 entries in the branch target buffer. Still further, an embodiment may include a return stack used to store link addresses of branch instructions which update a link resource ("branch and link" instructions). The fetch/decode/issue unit 14 may provide link addresses when branch instructions which update the link register are fetched for pushing on the return stack, and the return stack may provide the address from the top entry of the return stack as a predicted return address. While any configuration may be used, one implementation may provide 8 entries in the return stack.

The fetch/decode/issue unit 14 decodes the fetched instructions and queues them in one or more instruction queues for issue to the appropriate execution units. The instructions may be speculatively issued to the appropriate execution units, again prior to execution/resolution of the branch instructions which cause the instructions to be speculative. In some embodiments, out of order execution may be employed (e.g. instructions may be issued in a different order than the program order). In other embodiments, in order execution may be used. However, some speculative issue/execution may still occur between the time that a branch instruction is issued and its result is generated from the execution unit which executes that branch instruction (e.g. the execution unit may have more than one pipeline stage).

The integer execution units 22A–22B are generally capable of handling integer arithmetic/logic operations, shifts, rotates, etc. At least the integer execution unit 22A is configured to execute branch instructions, and in some embodiments both of the integer execution units 22A–22B may handle branch instructions. In one implementation, only the execution unit 22B executes integer multiply and divide instructions although both may handle such instructions in other embodiments. The floating point execution units 24A–24B similarly execute the floating point instructions. The integer and floating point execution units 22A–22B and 24A–24B may read and write operands to and from the register file 28 in the illustrated embodiment, which may include both integer and floating point registers. The load/store units 26A–26B may generate load/store addresses in response to load/store instructions and perform cache accesses to read and write memory locations through the data cache 30 (and through the bus interface unit 32, as needed), transferring data to and from the registers in the register file 28 as well.

The instruction cache 12 may have any suitable configuration and size, including direct mapped, fully associative, and set associative configurations. Similarly, the data cache 30 may have any suitable configuration and size, including any of the above mentioned configurations. In one implementation, each of the instruction cache 12 and the data cache 30 may be 4 way set associative, 32 kilobyte (kb) caches including 32 byte cache lines. Both the instruction cache 12 and the data cache 30 are coupled to the bus interface unit 32 for transferring instructions and data into and out of the caches in response to misses, flushes, coherency activity on the bus, etc.

In one implementation, the processor 10 is designed to the MIPS instruction set architecture (including the MIPS-3D and MIPS MDMX application specific extensions). The MIPS instruction set may be used below as a specific example of certain instructions. However, other embodiments may implement the IA-32 or IA-64 instruction set architectures developed by Intel Corp., the PowerPC instruction set architecture, the Alpha instruction set architecture, the ARM instruction set architecture, or any other instruction set architecture.

It is noted that, while FIG. 1 illustrates two integer execution units, two floating point execution units, and two load/store units, other embodiments may employ any number of each type of unit, and the number of one type may differ from the number of another type.

TLB CAM Circuits

Figure 2:
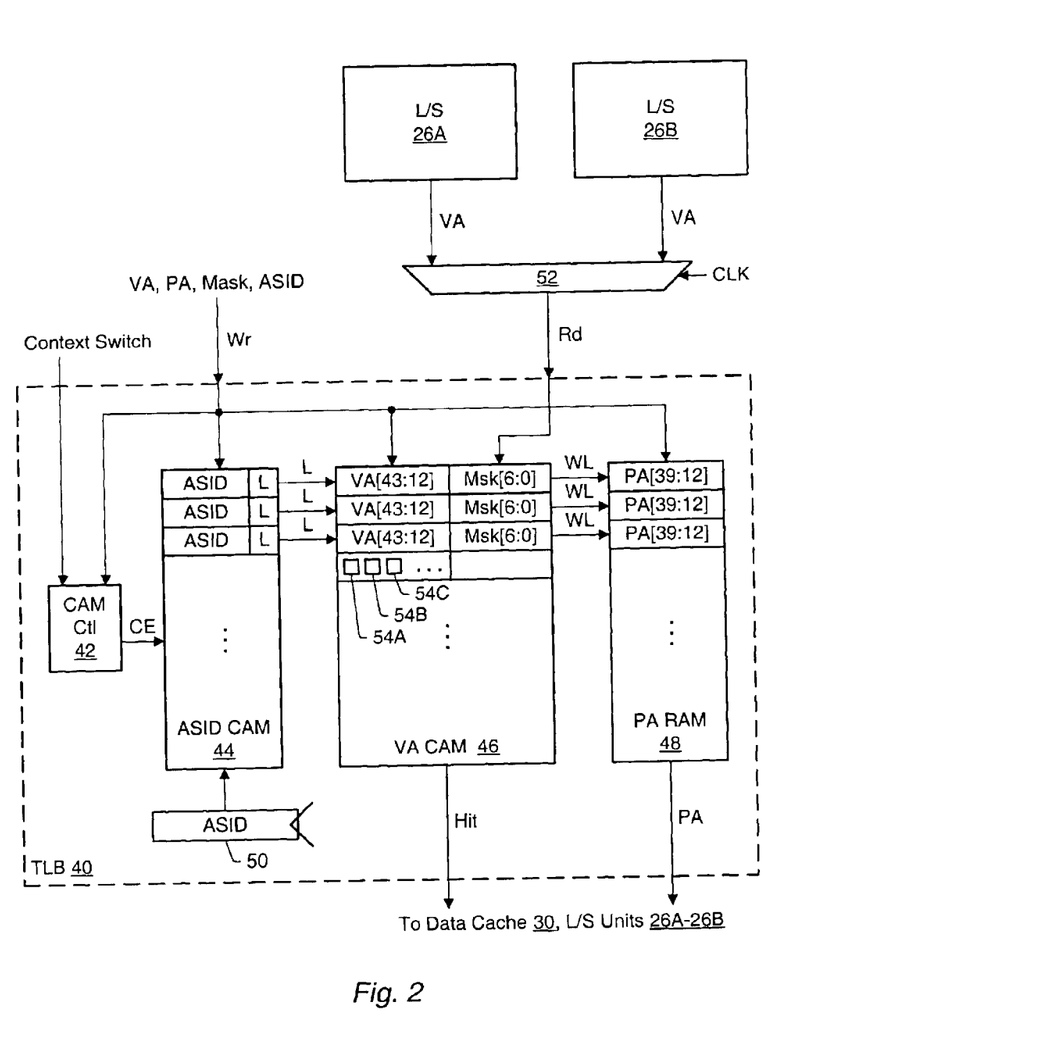
FIG. 2 is a block diagram of a pair of load/store units and a translation lookaside buffer (TLB).

Turning now to FIG. 2, a block diagram of the load/store units 26A–26B and a translation lookaside buffer (TLB) 40 is shown. Other embodiments are possible and contemplated. In the embodiment of FIG. 2, the TLB 40 includes a CAM control circuit 42, an address space identifier (ASID) CAM 44, a virtual address (VA) CAM 46, a physical address (PA) RAM 48, and a current ASID register 50. The load/store units 26A–26B are coupled through a multiplexor (mux) 52 to a read port of the TLB 40. The read port is coupled to the VA CAM 46. The TLB 40 also includes a write port coupled to the CAM control circuit 42, the ASID CAM 44, the VA CAM 46, and the PA RAM 48. The CAM control circuit 42 is coupled to receive a context switch indication and is coupled to provide a CAM enable (CE) to the ASID CAM 44, which is further coupled to the current ASID register 50. The ASID CAM 44 is also coupled to provide an L bit from each entry of the ASID CAM 44 to corresponding entries of the VA CAM 46. The VA CAM 46 is coupled to provide a hit signal output from the TLB 40 to the data cache 30 and the load/store units 26A–26B. The VA CAM 46 is coupled to provide word lines (WL) to each corresponding entry of the PA RAM 48, which outputs a physical address (PA) to the data cache 30 and the load/store units 26A–26B.

The TLB 40 comprises a plurality of TLB entries for storing virtual to physical address translations. Each TLB entry includes an entry in the ASID CAM 44, an entry in the VA CAM 46, and an entry in the PA RAM 48. The entry in the ASID CAM 44 stores the ASID corresponding to the translation and an L bit, as illustrated in FIG. 2. The L bit will be described in further detail below. The entry in the VA CAM 46 includes a portion of the virtual address (e.g. VA[43:12] in FIG. 2) corresponding to the translation and a mask field (e.g. Msk[6:0] in FIG. 2). Generally, the portion of the virtual address stored in a given entry is the portion which is translated from virtual to physical (e.g. excluding the offset within a page). A page is the range of addresses translated by the same translation. For example, in this embodiment, the minimum page size is 4 kilobytes and thus the least significant 12 bits are not translated. The mask field is used for embodiments which support variable page sizes, as described in more detail below. The entry in the PA CAM 48 stores a portion of the physical address corresponding to the translation. Again, the stored portion may be the portion which is translated from virtual to physical (e.g. excluding the offset within the page). For brevity, the discussion below may refer to the virtual address and the physical address stored in the TLB. It is understood that only a portion of such addresses may actually be stored. While the illustrated embodiment stores the physical address in the PA RAM 48, additional information may also be stored in the PA RAM 48. For example, various page protection bits, cacheability information for the page, etc. may be stored in the entry as well.

The TLB 40 is configured to look up a virtual address presented on the read port in the VA CAM 46 to determine if a virtual to physical address translation is stored in the TLB 40. Particularly, the VA CAM 46 compares the virtual address presented on the read port to the virtual addresses stored in the VA CAM 46. If a match is detected in a given entry, the VA CAM 46 activates the corresponding word line (WL) to cause the PA RAM 48 to output the physical address stored in the corresponding entry. More particularly, the VA CAM 46 comprises a set of CAM cells (e.g. cells 54A, 54B and 54C) which store the bits of the virtual address for each entry of the VA CAM 46. Each CAM cell includes circuitry for producing an indication of whether or not an input virtual address bit (from the read port) is equal to the bit stored in that CAM cell. Combining the comparison results from each CAM cell in the entry results in a hit indication for the entry (e.g. the activation of the word line to the PA RAM 48). The hit indications may be combined to produce the hit signal output by the VA CAM 46. The ASID CAM 44 similarly comprises a set of CAM cells (not shown in FIG. 2) storing the ASID bits for each entry.

In one embodiment, the TLB 40 may support variable page sizes using the mask field in the VA CAM 46. For example, one embodiment of processor 10 is compatible with the MIPS instruction set architecture. In that architecture, page sizes from 4 kilobytes to 64 Megabytes in multiples of 4 are supported (e.g. 4 kilobytes, 16 kilobytes, 64 kilobytes, etc. are supported). Thus, each mask bit in the mask field may be used to mask two address bits in the VA field. For example, mask bit Msk[0] may be used to mask VA[13:12] if a page size larger than 4 kilobytes is selected; mask bit M[1] may be used to mask VA[15:14] if a page size larger than 16 kilobytes is selected; etc. Other embodiments may assign one mask bit per virtual address bit (if page sizes in multiples of 2 are supported or to provide more granularity) or one mask bit per multiple virtual address bits depending on the page sizes supported. Depending on the selected page size, one or more mask bits in the mask field may be set (thus masking the corresponding VA bits in the comparison). The circuitry for comparing the maskable address bits may receive the corresponding mask bit and may indicate equality regardless of the actual values of the input virtual address bit and the stored virtual address bit if the mask bit is set. Other embodiments may assign the clear state of the mask bits to indicate masking, if desired.

In the present embodiment, a virtual address includes two components, the VA generated from one or more address operands of an instruction and an address space identifier (ASID). Generally, an address space identifier is a value which identifies the process being executed when the virtual address is generated. The ASID may thus separate the address spaces of different processes, thereby preventing one process from accessing or changing values in memory locations belonging to another process. That is, since the ASID is part of the virtual address, the same VA generated by two processes does not hit in the same TLB entry and thus does not translate to the same physical address.

The current ASID in the current ASID register 50 is thus logically part of the detection of a hit in a given TLB entry. However, the current ASID may change relatively infrequently (i.e. at context switches between processes). Accordingly, in the present embodiment, the ASID is compared to the ASID CAM 44 entries on a context switch (after the new ASID has been stored in the current ASID register 50). The CAM control circuit 42 receives an indication of the context switch from other circuitry in the processor 10 and asserts the CE signal to the ASID CAM 44 to cause a compare of each ASID CAM 44 entry with the current ASID. The result of each comparison is captured in the corresponding entry as the L bit shown in FIG. 2.

Additionally, when a TLB entry is written with new information via the write port (including an ASID), the CAM control circuit 42 may detect the write and assert the CE signal to the ASID CAM 44 to ensure that the L bit for the updated entry is properly generated (although a CAM of each entry is performed in this case as well, for the present embodiment). Other embodiments may compare the ASID to be written separate from the CAM and may store the L bit in the updated entry when writing the ASID into that entry.

The L bit may indicate the comparison result in any fashion. For example, if the L bit is set, the ASID in that entry matched the current ASID during the last comparison and if the L bit is clear, the ASID in that entry did not match the current ASID during the last comparison. Other embodiments may use the opposite meanings of the set and clear states, or any other indication.

The L bit from each entry is output by the ASID CAM 44 to the VA CAM 46. The VA CAM 46 incorporates the L bit in generating the hit result for the corresponding entry. Specifically, if the L bit indicates that the ASID in a TLB entry does not match the current ASID, the VA CAM 46 does not detect a hit in that TLB entry. If the L bit indicates that the ASID in the TLB entry does match the current ASID, the VA CAM 46 may detect a hit in that TLB entry if the VA matches the input virtual address. Viewed in another way, the L bit may enable a given VA CAM 46 entry for comparison to the input virtual address.

Since the ASID CAM 44 is not activated for each TLB lookup on the read port, the power that would be consumed in performing the ASID CAM compare is not consumed. Instead, power is consumed in the ASID CAM 44 at a context switch or after an update on the write port of the TLB 40. Additionally, since the result is precomputed and represented in the L bit, the delay in generating the hit indication for an entry may, in some cases, be less than if the ASID CAM compare were performed for each access.

As mentioned above, the write port of the TLB 40 is used to write translation information into the TLB 40 (e.g. in response to a TLB miss for a given virtual address). In one embodiment compatible with the MIPS instruction set architecture, a TLB miss causes an exception. The exception software determines the virtual to physical address translation (including the ASID, the VA, the PA, the mask, and the entry to be updated) and stores the translation information in one or more registers of the processor 10. The storing of the information in the registers may cause the update to the TLB 40 to occur. In other embodiments, TLB fills may be performed in hardware and/or microcode. In response to a write on the write port, the TLB 40 updates the selected entry with the provided information. In other embodiments, the TLB 40 may select the entry to update even if software provides the entry information.

Figure 3:
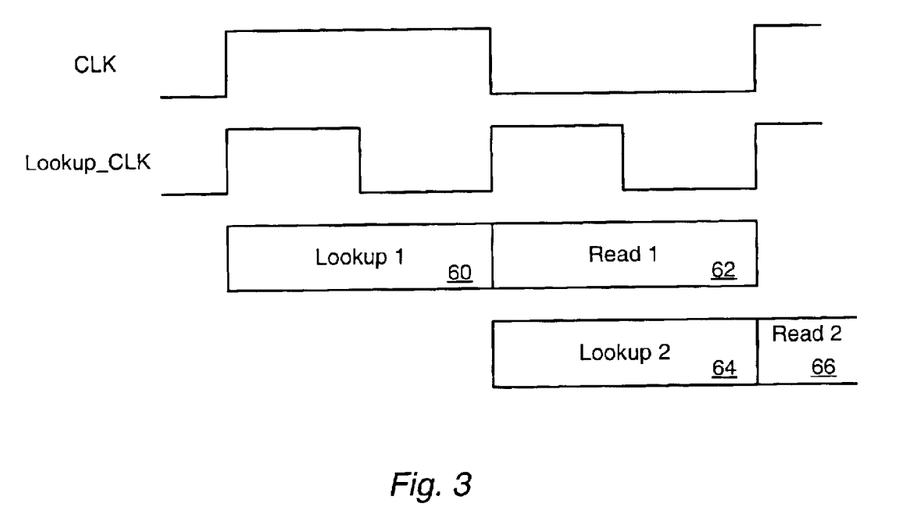
FIG. 3 is a timing diagram illustrating lookups in one embodiment of the TLB shown in FIG. 2.

In the present embodiment, the TLB 40 supplies address translations for load/store operations performed by the load/store units 26A–26B. In one embodiment, the TLB 40 performs TLB lookups and reads the PA out in a pipelined fashion and performs two lookups per clock cycle of the clock for the processor 10 (shown as CLK herein). Accordingly, mux 52 selects the address from the load/store unit 26A for access on the read port of the TLB 40 during the first phase of the clock signal CLK, and the address from the load/store unit 26B for access on the read port of the TLB 40 during the second phase of the clock signal CLK. FIG. 3 is a timing diagram illustrating the pipelined lookup and read. A cycle of the clock signal CLK is illustrated, along with a lookup clock signal (Lookup_CLK) generated from the clock signal CLK and used to clock the lookup in the VA CAM 46. The Lookup_CLK is twice the frequency of the clock signal CLK. During the first illustrated period of the Lookup_CLK signal, the TLB lookup for the load/store unit 26A virtual address is performed (reference numeral 60). The read of the PA RAM 48 is performed in the second period of the Lookup_CLK (i.e. during the second phase of the illustrated clock cycle of the CLK clock signal—reference numeral 62). Also during the second period of the Lookup_CLK, the TLB lookup for the load/store unit 26B is performed (reference numeral 64). The corresponding read of the PA RAM 48 is performed in the first phase of the next clock cycle of the CLK clock signal (reference numeral 66). It is noted that other embodiments may perform only one TLB lookup per clock cycle or more than two TLB lookups per clock cycle, and other embodiments may or may not be pipelined.

Generally, a CAM cell comprises: (i) at least one storage cell for storing a bit of a value stored in an entry including that CAM cell; and (ii) circuitry for outputting an indication of a comparison result between the bit and an input bit to the CAM. In some embodiments, multiple storage cells may be included to allow for the storage of don't care values in the cell.

It is noted that, while the ASID is included in the present embodiment, other embodiments may not include an ASID. Additionally, embodiments in which the ASID is included and the ASID is compared for each lookup in the TLB are contemplated. Furthermore, embodiments which support one page size are contemplated (in which the mask field in the VA CAM 46 may not be included). While the example shown in FIG. 2 (and in FIGS. 3–8 below) discuss the CAMs in the context of a TLB, the CAMs may be used in other circuitry besides a TLB, as desired. The CAMs may be used in any circuitry that CAMs are desirable. While the present embodiment illustrates the current ASID register 50 as being part of the TLB 40, other embodiments may locate the current ASID register 50 in other locations and may provide the current ASID as an input to the TLB 40.

It is noted that, in some embodiments, the mux 52 may include an input for fetch address translation (e.g. if instruction fetching shares the TLB 40 with the load/store units 26A–26B or if instruction fetches which miss a separate instruction TLB access the TLB 40). Furthermore, the mux 52 may include a test input for testing the TLB 40.

Figure 4:
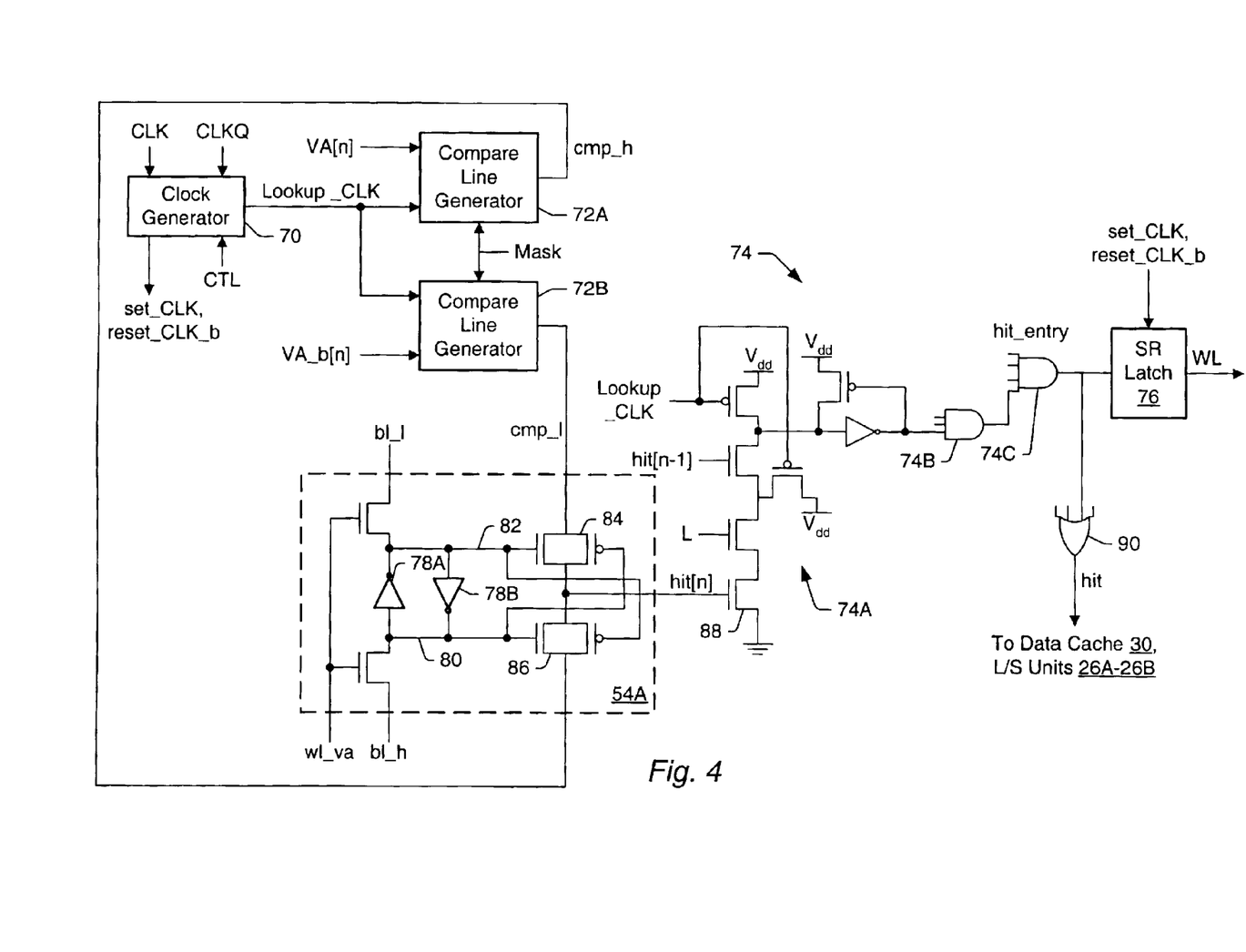
FIG. 4 is a circuit diagram illustrating one embodiment of circuitry associated with an entry in the VA CAM shown in FIG. 2.

Turning now to FIG. 4, a circuit diagram illustrating circuitry associated with a first CAM cell 54A of the VA CAM 46 and circuitry for generating the hit for the entry which includes the first CAM cell 54A is shown. Other embodiments are possible and contemplated. The CAM cell 54A corresponds to virtual address bit "n" (VA[n]) of an entry in the VA CAM 46. Other CAM cells and entries of the VA CAM 46 may be configured similarly. The embodiment of FIG. 4 includes a clock generator circuit 70 (which may be shared with other CAM cells), a pair of compare line generator circuits 72A–72B, AND circuit 74, and a set-reset (SR) latch 76. The clock generator circuit 70 is coupled to receive the clock signal CLK and a clock signal CLKQ which is 90 degrees out of phase with the clock signal CLK, and also a control input (CTL). The clock generator circuit 70 is configured to output the Lookup_CLK signal to the compare line generator circuits 72A–72B and is configured to output a set_CLK and a reset_CLK_b signal to the SR latch 76. The compare line generator circuit 72A is coupled to receive the input VA[n] bit for comparison to the bit stored in the CAM cell 54A, as well as the mask bit corresponding to VA[n] ("Mask" in FIG. 4). The compare line generator circuit 72B is coupled to receive the complement of the input VA[n] bit (VA_b[n]) and the mask bit as well. The compare line generator circuits 72A–72B generate pulses (on the cmp_h and cmp_l signals) responsive to the Lookup_CLK, the input VA[n] bit (or its complement) and the mask bit. The CAM cell 54A is coupled to receive the cmp_h and cmp_l signals, and is configured to output a hit[n] signal indicating whether or not the input VA[n] bit matches the bit stored in the CAM cell 54A. Particularly, the CAM cell 54A includes a storage cell formed by the cross-coupled inverters 78A and 78B. The storage cell has two nodes 80 and 82 on which voltages are held indicating the state of the bit stored in the storage cell. The node 80 stores the state of the bit and the node 82 stores the state of the complement of the bit. In other words, if the cell is storing a logical one the node 80 is at a $V_{dd}$ voltage and the node 82 is at a ground voltage. If the cell is storing a logical zero the node 80 is at a ground voltage and the node 82 is at a $V_{dd}$ voltage. The CAM cell 54A further includes two passgate circuits 84 and 86, each formed from the parallel connection of a PMOS transistor and an NMOS transistor. The node 80 is coupled to the gate terminal of the PMOS transistor of the passgate circuit 84 and to the gate terminal of the NMOS transistor of the passgate circuit 86. The node 82 is coupled to the gate terminal of the NMOS transistor of the passgate circuit 84 and to the gate terminal of the passgate circuit 86. One of the terminals of the passgate circuit 84 is coupled to receive the cmp_l signal and the other terminal is coupled to the node on which the hit[n] signal is conveyed. One of the terminals of the passgate circuit 86 is coupled to receive the cmp_h signal and the other terminal is coupled to the node on which the hit[n] signal is conveyed. The hit[n] signal is coupled to the gate terminal of a transistor 88 included in a dynamic domino AND gate 74A which forms part of the AND circuit 74. Other transistors in the dynamic domino AND gate 74A are coupled to receive the L bit from the ASID CAM 44 entry corresponding to the entry including the CAM cell 54A and a hit[n-1] signal corresponding to another bit of the virtual address stored in the entry including the CAM cell 54A (e.g. VA[n-1]). The dynamic domino AND gate 74A precharges during the low phase of the Lookup_CLK signal as illustrated in FIG. 4. Also included in the AND circuit 74A are AND gates 74B and 74C (and other AND gates not shown). The output of the AND circuit 74 is a hit_entry signal indicating whether or not the input VA is a hit in the entry which includes the CAM cell 54A. The output is coupled to the SR latch 76 and to an OR gate 90 which generates the hit signal output from the VA CAM 46. The output of the SR latch 76 is the word line (WL) for the corresponding PA RAM 48 entry.

Since CLK and CLKQ are 90 degrees out of phase (often referred to as quadrature clocks), the clock generator circuit 70 may generate the Lookup_CLK signal by exclusive ORing the CLK and CLKQ signals. The clock generator circuit 70 may conditionally generate the Lookup_CLK (e.g. responsive to a lookup occurring in the current phase of the CLK signal) using the CTL signal. The set_CLK and reset_CLK_b clock signals are also generated. In one embodiment, the set_CLK signal is the complement of the Lookup_CLK signal. The reset_CLK_b signal is the complement of a signal which is one period of the Lookup_CLK signal delayed from the Lookup_CLK signal, and further delayed using a chain of inverters to ensure a minimum pulse width on the WL signal output from the SR latch 76 (described in more detail below).

As mentioned above, the compare line generator circuits 72A–72B are configured to generate pulses cmp_h and cmp_l. If the VA[n] bit is not masked via the corresponding mask bit, the compare line generator circuits 72A–72B generate complementary pulses. As used herein, a pulse is a transition from a first binary state of a signal to a second binary state of a signal followed by a second transition from the second binary state to the first binary state. In the examples used herein, the pulse will be a pulse from binary zero to binary one and back to binary zero, although the opposite type of pulse may be used. A pair of pulses are complementary if only one of the two signals is pulsed in response to any given input. In the embodiment of FIG. 4, if the VA[n] bit is a binary one, the cmp_h signal is pulsed and the cmp_l signal in not pulsed. If the VA[n] bit is a binary zero (and thus the VA_b[n] bit is a binary one), the cmp_l signal is pulsed and the cmp_h signal is not pulsed. Accordingly, a pulse on the cmp_h signal is an indication that the VA[n] bit is a binary one, and a pulse on the cmp_l signal is an indication that the VA[n] bit is a binary zero.

The passgate circuits 86 and 84 are coupled to receive the cmp_h and cmp_l signals, respectively. Coupled as shown in FIG. 4, the passgate circuits 86 and 84 pass one of the cmp_h and cmp_l signals to the node on which the hit[n] signal is carried. For example, if the CAM cell 54A is storing a binary one, the passgate circuit 86 passes the cmp_h signal to the hit[n] signal. If the CAM cell 54A is storing a binary zero, the passgate circuit 84 passes the cmp_l signal to the hit[n] signal. Accordingly, a pulse on the hit[n] signal is indicative of a match between the VA[n] bit and the bit stored in the CAM cell 54A. That is, the cmp_l signal is pulsed if the VA[n] bit is a binary zero and is passed if the CAM cell 54A is storing a binary zero. The cmp_h signal is pulsed if the VA[n] bit is a binary zero and is passed in the CAM cell 54A is storing a binary one. In any other case, the signal passed on the hit[n] signal is not pulsed, and thus a mismatch is detected.

The AND circuit 74 logically ANDs the hit signals from each of the CAM cells forming an entry of the VA CAM 46. Thus, if a given CAM cell detects a mismatch between its stored bit and the corresponding input VA bit, the result of the logical AND is no pulse (a miss). If all CAM cells detect a match, the result of the logical AND is a pulse (hit).

AND gate 74A logically ANDs the L bit, the hit[n] signal, and the hit[n-1] signal. Other similar AND gates may logically AND other hit signals corresponding to other bits in the VA CAM 46 entry. The output of each of these AND gates is an input to the AND gate 74B or a similar AND gate. The output of the AND gate 74B and similar AND gates are coupled as inputs to the AND gate 74C, etc. Thus, a tree of AND gates may be used to perform the logical AND of the hit signals from each bit of the virtual address. The number of levels of AND gates may depend on the number of inputs in each gate and the number of virtual address bits implemented by the processor 10.

While AND gates are used in the illustrated AND circuit 74, any circuitry which receives the hit signals from CAM cells and performs a logical AND function to produce the result may be used. For example, NAND gates may be used, or a combination of NAND and AND gates may be used. Any Boolean equivalent of such circuits may be used.

It is noted that, while the L bit from the ASID CAM 44 is shown coupled to one of the inputs to the AND gate 74A, the L bit may be logically ANDed with the Lookup_CLK signal to provide a pulse similar to the pulses output by the CAM cells 54. Alternatively, the ASID CAM 44 may be configured to provide the L bit as a pulse to the AND gate 74A.

AND gate 74A is illustrated as a dynamic domino AND gate. AND gates 74B and 74C (and other AND gates used to AND other portions of the hit signals together) may also be dynamic domino AND gates. Alternatively, other types of dynamic AND gates may be used or static AND gates may be used. Generally, dynamic logic gates are precharged to a first state (e.g. logical zero in the illustrated case). The inputs to the gate during an evaluation state may cause a change to a second state dependent on the inputs and the logical function performed by the dynamic gate. In the case of a dynamic AND, if each of the inputs pulse to a logical one, the output is changed to a logical one also. If one or more of the inputs do not pulse, the output does not change state.

The logical AND structure may, in some embodiments, consume less power than the exclusive NOR-OR structure used in some CAMs. For example, in the case of the VA CAM 46, most entries may not match the input VA. For entries which do not match, at least some of the AND circuitry does not discharge (which would consume power).

Only the entry which matches (if any) consumes the full amount of power that the AND circuit may consume. On the other hand, the exclusive NOR-OR structure consumes power when a miss is detected.

The compare line generator circuits 72A–72B may further be configured to generate non-complementary pulses if the mask bit is set. Particularly, the compare line generator circuits 72A–72B may pulse both the cmp_h and cmp_l signals if the mask bit is set. Since one of the cmp_h or cmp_l signals is passed by the passgate circuits 84 and 86 to the hit[n] signal for any state in the CAM cell 54A, pulsing both signals ensures a pulse on the hit[n] signal (indicating a hit). Thus, a mismatch between VA[n] and the bit stored in the CAM cell 54A does not cause a miss if the mask bit is set.

Figure 5:
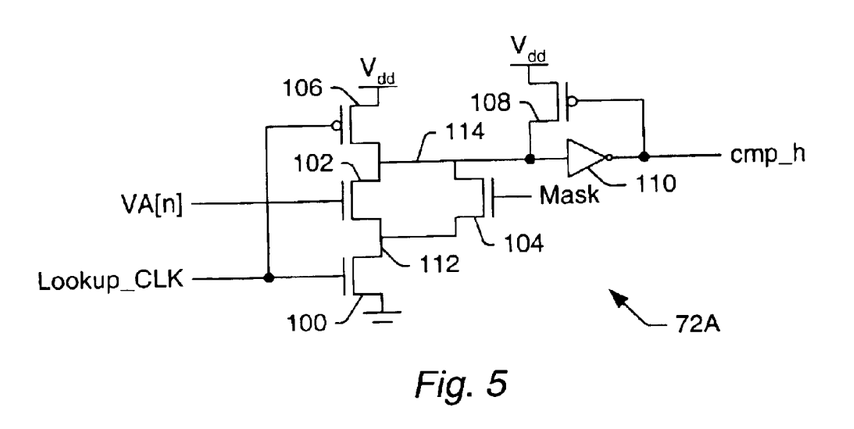
FIG. 5 is a circuit diagram of one embodiment of a compare line generator circuit shown in FIG. 4.

FIG. 5 is a circuit diagram of one embodiment of the compare line generator circuit 72A. The compare line generator circuit 72B may be similar, except that the VA_b[n] signal may be substituted for the VA[n] signal as illustrated in FIG. 5. Other embodiments are possible and contemplated. In the embodiment of FIG. 5, the compare line generator circuit 72A includes NMOS transistors 100, 102, and 104, PMOS transistors 106 and 108, and inverter 110. The transistor 100 has a terminal coupled to the ground voltage reference, a terminal coupled to a node 112 to which a terminal of the transistors 102 and 104 are also coupled, and a gate terminal coupled to receive the Lookup_CLK signal. The transistors 102 and 104 each have terminals coupled to a node 114 to which a terminal of the transistor 106 is coupled. The gate terminal of the transistor 102 is coupled to receive the VA[n] signal and the gate terminal of the transistor 104 is coupled to receive the mask bit. The transistor 106 has a terminal coupled to the $V_{dd}$ voltage reference and has its control terminal coupled to receive the Lookup_CLK signal. The node 114 is coupled to the input of the inverter 110 and to a terminal of the transistor 108, which has another terminal coupled to the $V_{dd}$ voltage reference and a control terminal coupled to the output of the inverter 110. The output of the inverter 110 is the cmp_h signal.

Generally, when the Lookup_CLK signal is asserted, if either the VA[n] bit is set or the mask bit is set, the combination of the transistors 100, 102, and 104 discharge the node 114, which causes the rising edge of a pulse on the cmp_h signal. When the Lookup_CLK signal is deasserted, the transistor 106 charges the node 114, providing the falling edge of the pulse. The transistor 108 is provided to hold the precharged voltage if the transistors 100, 102, and 104 do not discharge the node 114.

Figure 6:
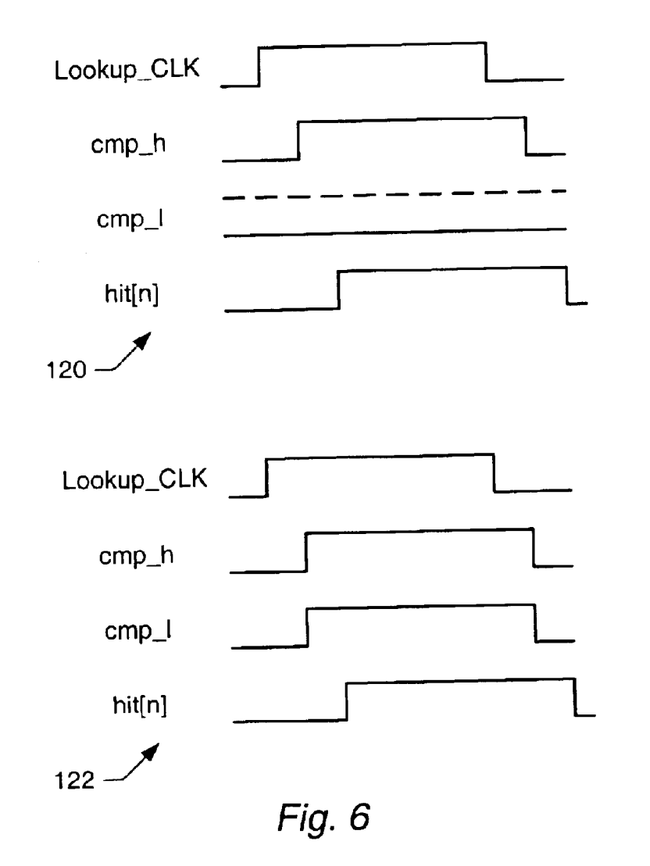
FIG. 6 is a set of timing diagrams illustrating operation of the compare line generator circuit shown in FIG. 5.

FIG. 6 includes a timing diagram 120 illustrating the operation of the compare line generator circuits 72A–72B if the VA[n] bit is set and the mask bit is clear. Responsive to the Lookup_CLK signal asserting, a pulse is generated on the cmp_h signal. The cmp_l signal is not pulsed since the VA_b[n] bit is clear in this case. Subsequently, if the bit stored in the CAM cell 54A is set, the hit[n] signal pulses as the cmp_h pulse is passed onto the hit[n] signal.

FIG. 6 also includes a timing diagram 122 illustrating the operation of the compare line generator circuits 72A–72B if the mask bit is set. In this case, both the cmp_h and cmp_l signals are pulsed. Since one of the cmp_h and cmp_l signals is passed through the CAM cell 54A, the hit[n] signal is pulsed as well.

It is noted that, in some embodiments, the mask feature may not be implemented. For example, embodiments in which a fixed page size is used may not have the masking feature. In such embodiments, the transistor 104 may be eliminated. Additionally, some of the address bits may not be masked (e.g. address bits which are more significant than the bits masked for the maximum page size). For those bits, the compare line generator circuits 72A–72B may not include the transistor 104 (or may include the transistor with the gate terminal grounded).

Returning to FIG. 4, note that the compare line generator circuits 72A–72B generate a pulse or pulses responsive to the Lookup_CLK signal and these pulses then propagate (assuming a hit) to the hit_entry signal. Depending on the frequency of operation of the CLK signal and the delay for propagating the pulses to the hit_entry signal, a varying amount of pulse on the hit_entry signal may extend into the next phase of the CLK signal (when the read occurs). In some cases at low frequency, none of the pulse may extend into the next phase of the CLK signal. To ensure that a word line signal is provided to the PA RAM 48 and to ensure that the word line signal is wide enough to allow the RAM to be read accurately at any operating frequency within a desired range of operating frequencies, the SR latch 76 may be used.

The SR latch 76 may capture the pulse on the hit_entry signal during the asserted phase of the set_CLK signal (which is the deasserted phase of the Lookup_CLK signal, since the set_CLK signal is the complement of the Lookup_CLK signal). The SR latch 76 may hold the captured pulse until the reset_CLK_b signal deasserts. As mentioned above, the reset_CLK_b signal is the complement of a signal which lags the Lookup_CLK signal by one period of the Lookup_CLK signal and is further delayed to provide a minimum pulse width on the WL signal. That is, the reset_CLK_b signal may be delayed such that, with the rising edge of the pulse on the hit_entry signal being the nearest to the end of the Lookup_CLK period as possible within the desired frequency operating range, the pulse width on the WL signal is long enough to accurately read the PA RAM 48.

Figure 7:
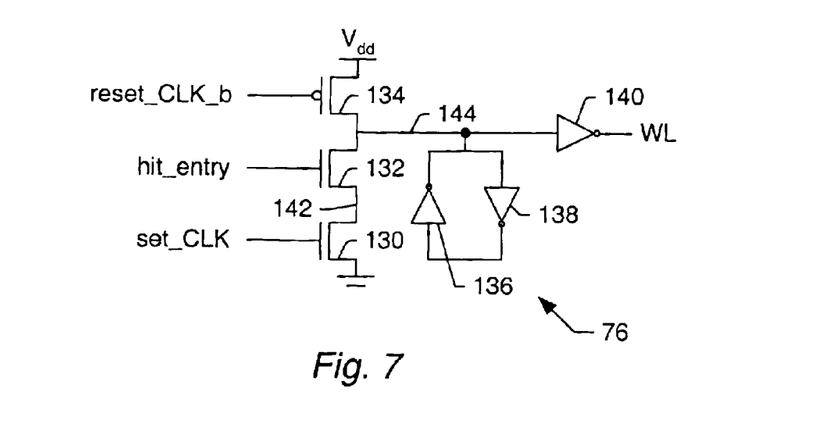
FIG. 7 is a circuit diagram of one embodiment of the SR latch shown in FIG. 4.

FIG. 7 is a circuit diagram of one embodiment of the SR latch 76. Other embodiments are possible and contemplated. In the embodiment of FIG. 7, the SR latch 76 includes NMOS transistors, 130 and 132 and PMOS transistor 134, a storage cell comprising cross-coupled inverters 136 and 138, and output inverter 140. The transistor 130 includes terminals coupled to the ground voltage reference and a node 142 to which the transistor 132 has a terminal coupled, and the gate terminal of the transistor 130 is coupled to receive the set_CLK signal. The transistor 132 includes a terminal coupled to a node 144 and has its gate terminal coupled to receive the hit_entry signal. The transistor 134 has a terminal coupled to the node 144, a node coupled to the $V_{dd}$ voltage reference, and a gate terminal coupled to receive the reset_CLK_b signal. The storage cell has one of its storage nodes coupled to the node 144, and the inverter 140 has its input coupled to the node 144. The output of the inverter 144 is the WL signal.

When both the set_CLK signal and the hit_entry signal are asserted, the transistors 130 and 132 discharge the node 144, causing the rising edge of a pulse on the WL signal. The storage cell formed from inverters 136 and 138 retains the binary zero on the node 144 (and thus the binary one on the WL signal) after one or both of the hit_entry and set_CLK signals deasserts and until the reset_CLK_b signal deasserts, charging the node 144 and thus causing the falling edge of the pulse on the WL signal.

Figure 8:
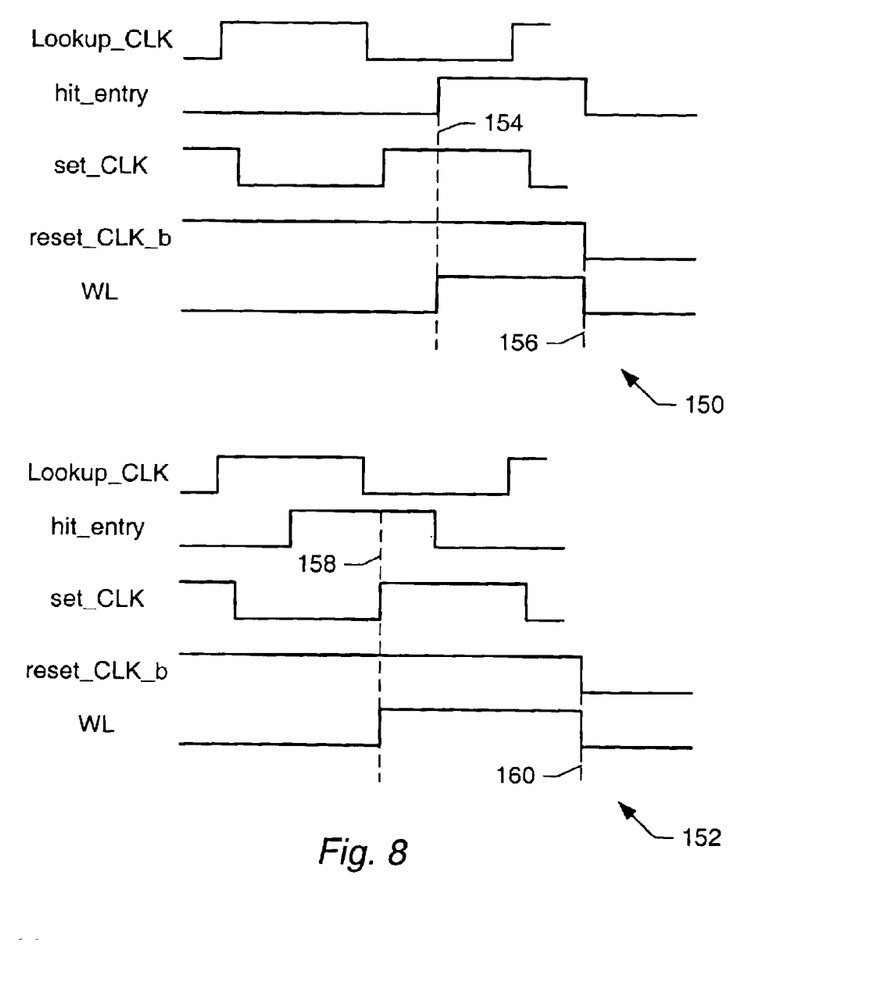
FIG. 8 is a set of timing diagrams illustrating operation of the SR latch shown in FIG. 7.

FIG. 8 includes two timing diagrams 150 and 152. The timing diagram 150 illustrates operation if the clock signal CLK is at a relatively high frequency, while the timing diagram 152 illustrates a relatively low frequency of operation.

In timing diagram 150, the hit entry pulse occurs relatively late in the period of the Lookup_CLK signal. Responsive to both the set_CLK and the hit_entry pulses being asserted (dotted line 154), the WL signal asserts. Subsequently, the reset_CLK_b signal deasserts (the complement of a signal lagging the Lookup_CLK by one clock period plus an additional delay), causing the WL signal to deassert (dotted line 156).

In timing diagram 152, the hit entry pulse occurs early in the period of the Lookup_CLK signal (since the frequency of the Lookup_CLK signal is lower and the delay through the VA CAM 46 is fixed). Particularly, in this example, the hit_entry pulse deasserts before the end of the Lookup_CLK signal period. Responsive to the set_CLK signal and the hit_entry signal being asserted (dotted line 158), the WL signal asserts. The WL signal remains asserted after the hit_entry pulse deasserts. Subsequently, the deassertion of the reset_CLK_b causes the deassertion of the WL signal (dotted line 160). In this case, the WL signal pulse is extended beyond the end of the hit_entry pulse by the SR latch 76.

It is noted that, while CMOS transistors have by used herein with a gate terminal which controls the electrical connection between two other terminals, other types of transistors may be used. Generally, a transistor may include at least three terminals, one of which is a control terminal for controlling the electrical connection between the other two terminals. For example, the gate terminal of a field effect transistor (such as a CMOS transistor) or the base terminal of a bi-polar junction transistor may be control terminals for those types of transistors.

As used herein, a voltage reference is a node which is powered, during use, with a predefined voltage (e.g. $V_{dd}$, ground, etc.).

It is noted that, while storage circuits are illustrated above as including crosscoupled inverters, any storage circuit may be used in other embodiments. For example, storage circuits have cross-coupled NAND or NOR circuits are contemplated. Generally, a storage circuit is any circuit which is capable of retaining state provided at its input after the input goes inactive or changes.

Figure 9:
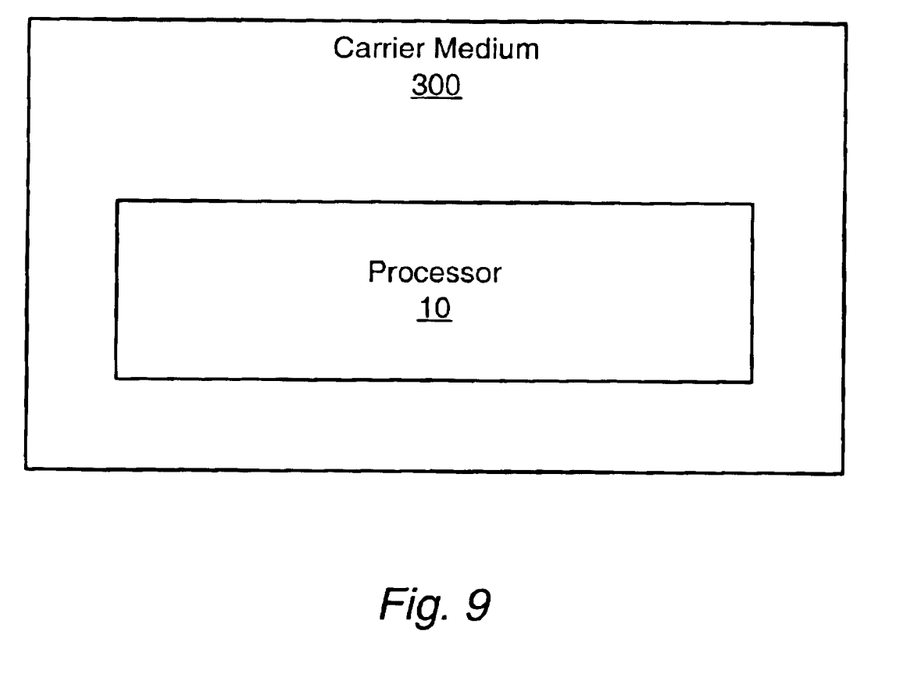
FIG. 9 is a block diagram of one embodiment of a carrier medium.

Turning next to FIG. 9, a block diagram of a carrier medium 300 including one or more data structures representative of the processor 10 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the data structure(s) of the processor 10 carried on carrier medium 300 may be read by a program and used, directly or indirectly, to fabricate the hardware comprising the processor 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the processor 10. The netlist may then be placed and routed to produce a data set describing geometric shapes to be applied to masks. The masks may then be used in various semiconductor fabrication steps to produce a semiconductor circuit or circuits corresponding to the processor 10. Alternatively, the data structure(s) on carrier medium 300 may be the netlist (with or without the synthesis library) or the data set, as desired.

While carrier medium 300 carries a representation of the processor 10, other embodiments may carry a representation of any portion of processor 10, as desired, including an TLB or portions thereof including one or more of an ASID CAM, a VA CAM, a PA RAM, a CAM control circuit, compare line generator circuits, AND tree circuits, SR latches, etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a first circuit coupled to receive a clock signal, a mask input, and a data signal, wherein the first circuit is configured to conditionally generate a first pulse responsive to the clock signal, the mask input, and the data signal;
   a second circuit coupled to receive the clock signal, the mask input, and a complement of the data signal, wherein the second circuit is configured to conditionally generate a second pulse responsive to the clock signal, the mask input, and the complement of the data signal; and
   a content addressable memory (CAM) cell coupled to receive the first pulse and the second pulse, wherein the CAM cell is configured to output one of the first pulse or the second pulse as a match output dependent on a bit stored in the CAM cell.

2. The apparatus as recited in claim 1 wherein the first pulse and the second pulse are complementary if the mask input does not indicate masking.

3. The apparatus as recited in claim 2 wherein each of the first pulse and the second pulse are generated if the mask input indicates masking, whereby the match output of the CAM cell indicates a match independent of the bit stored in the CAM cell.

4. The apparatus as recited in claim 1 wherein each of the first pulse and the second pulse are generated if the mask input indicates masking, whereby the match output of the CAM cell indicates a match independent of the bit stored in the CAM cell.

5. The apparatus as recited in claim 1 further comprising:
   a second CAM cell configured to store a second bit, wherein the second CAM cell is configured to provide a second match output; and
   a circuit coupled to receive the match output and the second match output, wherein the circuit is configured to logically AND at least the match output and the second match output to generate a hit output.

6. The apparatus as recited in claim 5 wherein the circuit comprises dynamic AND circuitry.

7. The apparatus as recited in claim 5 further comprising a latch circuit coupled to receive the hit output and configured to latch the hit output responsive to a first clock signal and to clear responsive to a second clock signal.

8. The apparatus as recited in claim 1 wherein the first circuit comprises a first transistor and a second transistor, each of the first and second transistors having terminals coupled to a first node and to a second node, and wherein a control terminal of the first transistor is coupled to the data signal and a control terminal of the second transistor is coupled to the mask input.

9. The apparatus as recited in claim 8 further comprising a third transistor having terminals coupled to the second node and to a first voltage reference, wherein a control terminal of the third transistor is coupled to the clock signal.

10. The apparatus as recited in claim 9 further comprising a fourth transistor having terminals coupled to the first node and a second voltage reference, wherein a control terminal of the fourth transistor is coupled to the clock signal.

11. The apparatus as recited in claim 10 further comprising an inverter coupled between the first node and an output node on which the first circuit is configured to convey the first pulse.

12. The apparatus as recited in claim 11 further comprising a fifth transistor having terminals coupled to the first node and the second voltage reference and having a control terminal coupled to the output node.

13. A method comprising:
conditionally generating a first pulse responsive to a clock signal, a mask input, and a data signal;
conditionally generating a second pulse responsive to the clock signal, the mask input, and the complement of the data signal; and
outputting one of the first pulse and the second pulse as a match output of a content addressable memory (CAM) cell dependent on a bit stored in the CAM cell.

14. The method as recited in claim 13 wherein the first pulse and the second pulse are complementary if the mask input does not indicate masking.

15. The method as recited in claim 14 wherein each of the first pulse and the second pulse are generated if the mask input indicates masking, whereby the match output of the CAM cell indicates a match independent of the bit stored in the CAM cell.

16. The method as recited in claim 13 wherein each of the first pulse and the second pulse are generated if the mask input indicates masking, whereby the match output of the CAM cell indicates a match independent of the bit stored in the CAM cell.

17. The method as recited in claim 13 further comprising:
outputting a second match signal from a second CAM cell configured to store a second bit; and
logically ANDing at least the match output and the second match output to generate a hit output.

* * * * *